(12) United States Patent
Grilletto et al.

(10) Patent No.: US 6,411,114 B1
(45) Date of Patent: Jun. 25, 2002

(54) UNIVERSAL TEST COUPON FOR PERFORMING PREQUALIFICATION TESTS ON SUBSTRATES

(75) Inventors: Carlo Grilletto, San Carlos; Jed Bayking, Union City, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/884,711

(22) Filed: Jun. 18, 2001

(51) Int. Cl.[7] .............................................. G01R 31/02
(52) U.S. Cl. ...................... 324/754; 324/765
(58) Field of Search ........................... 438/14; 523/451, 523/460; 324/158, 754

(56) References Cited

U.S. PATENT DOCUMENTS 5,489,852 A * 2/1996 Gomez ...................... 324/754
6,284,818 B1 * 9/2001 Kawata ...................... 523/451

* cited by examiner

*Primary Examiner*—John F. Niebling
*Assistant Examiner*—Andre C Stevenson
(74) *Attorney, Agent, or Firm*—Sawyer Law Group, L.L.P.

(57) ABSTRACT

A test coupon for performing pre-qualification test on a substrate is disclosed. The test coupon includes at least two substrate test structures, and an edge connector for providing external electrical connections. Traces patterned on the test coupon connect the test structures with the edge connector, such that a test apparatus maybe coupled to the edge connector for testing the test coupon without the need to manually solder connections to the test coupon. The test coupon may also be used to perform the actual qualification of certain process changes in substrate construction and to monitor production lot quality and reliability.

9 Claims, 4 Drawing Sheets

US 6,411,114 B1

UNIVERSAL TEST COUPON FOR PERFORMING PREQUALIFICATION TESTS ON SUBSTRATES

FIELD OF THE INVENTION

The present invention relates to flip-chip packages, and more particularly to a universal test coupon for performing pre-qualification tests on organic substrates.

BACKGROUND OF THE INVENTION

Flip-chip refers to a surface mount chip technology where solder bumps are placed on a chip, and the chip is flipped over and attached to an organic substrate. Depending on the particular application, the substrate may be manufactured with many layers and various structures built both on and between each layer. Examples of the structures include patterns of traces called combs and via chains. There are different vendors of organic substrates, and each vendor may use different materials and technologies to fabricate the substrates.

In order to test the reliability of the substrates before manufacturing and assembling expensive production versions, samples of the substrates called test coupons are manufactured and subjected to pre-qualification tests to discover faults in the production process and to project the reliability and life of the substrates. The most critical and expensive test is to put the test coupons under bias, moisture, and high-temperature conditions, which is referred to as a Bias/Humidity/Temperature (BHT) test, including some highly accelerated versions known as (HAST).

The test coupons typically have all of the critical dimensions of the production substrate, but are simplified. They do not typically contain all of the vulnerable test structures on one coupon. They are not strategically placed on a palate to capture faults that are heterogeneously distributed on a palate.

Although substrate manufacturers have used test coupons for some time, the use of traditional test coupons has disadvantages. Substrates are manufactured on a large palate with usually 40–50 substrates per palate, similar to chips on a wafer. One disadvantage is that problems that may arise during manufacturing of the substrates may not have a homogeneous fault distribution. For example, a manufacturing process may cause isolated faults on the left side of a palate, but the problem may not be detected if only one coupon on the right side of the palate is made. This reflects a typical manufacturing fault distribution issue.

Another disadvantage is that the Bias/Humidity/Temperature test requires special boards and sockets on which to connect the test coupons and to place in a test chamber. Typically forty-four test coupons are required to perform a qualification test. Each type of test coupon, however, requires a different type of connection, and each test coupon must be hand soldered to the sockets. Due to the number of test coupons needed to obtain a statistically valid evaluation and the number of connections per coupon, hand soldering increases the time and expense the testing.

Accordingly, what is needed is an improved method for performing pre-qualification test on flip-chip organic substrates.

SUMMARY OF THE INVENTION

The present invention provides a universal test coupon for performing pre-qualification test on a substrate. The test coupon includes at least two substrate test structures, and an edge connector for providing external electrical connections. Traces patterned on the test coupon connect the test structures with the edge connector, such that a test apparatus maybe coupled to the edge connector for testing the test coupon without the need to manually solder connections to the test coupon.

According to the system and method disclosed herein, the universal test coupon more accurately represents the distribution of quality of the fabrication process due to the multiple test structures incorporated into the test coupon. In addition, the incorporation of an edge card connector on the test coupon eliminates the need to hand solder the test coupon for pre-qualification testing. The universal test coupon may also be used to perform the actual qualification of certain process changes in substrate construction and to monitor production lot quality and reliability.

DETAILED DESCRIPTION

The present invention relates to techniques for testing flip-chip and other organic substrates. The following description is presented to enable one of ordinary skill in the art to make-and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

The present invention provides a universal test coupon for organic substrates. Although the preferred embodiment will be described in terms of a test coupon for flip-chip organic substrates, the present invention may also be used for other types of substrates including ceramic substrates.

Figure 1:
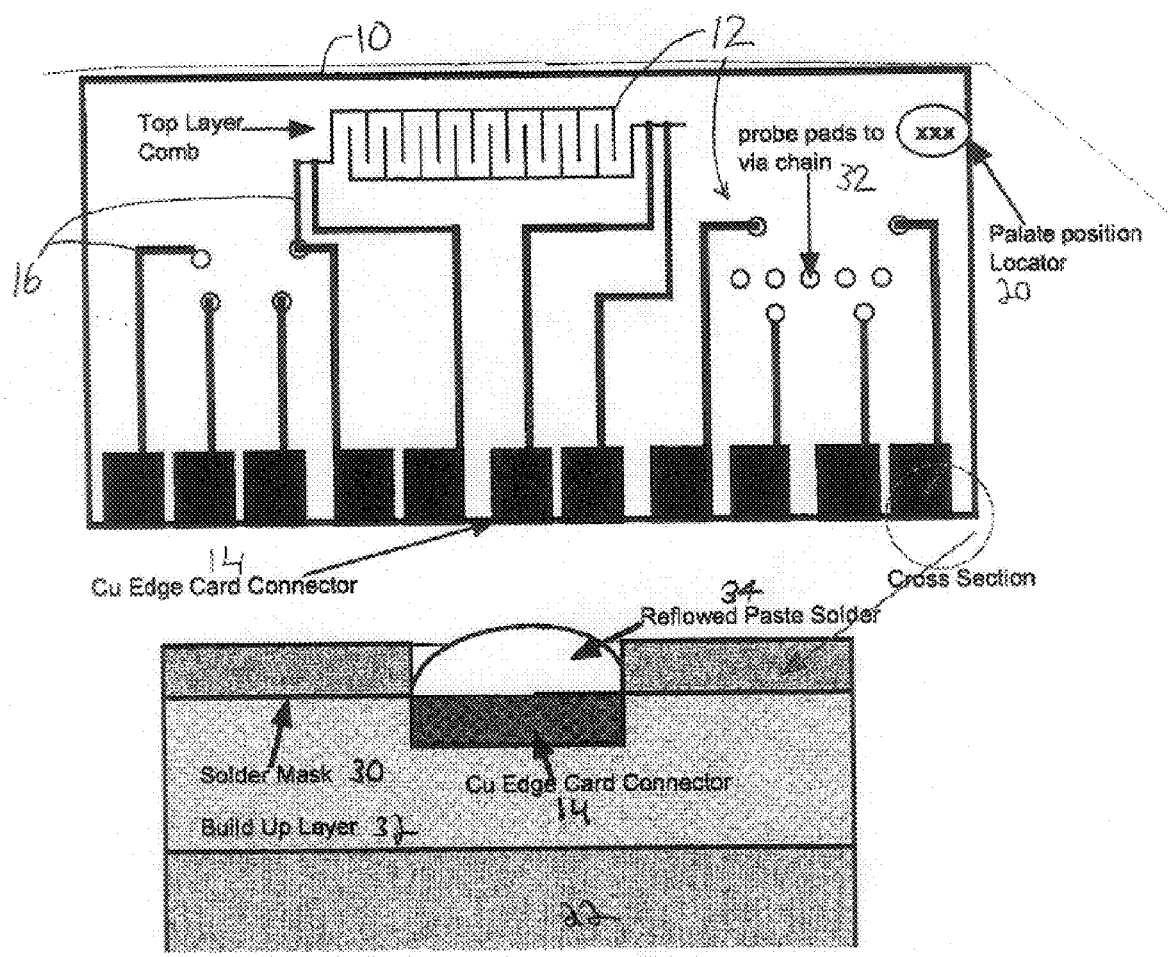
FIG. 1A is a diagram showing a top metal layer of a test coupon in accordance with the present invention.
FIG. 1B is a cross-section view of the test coupon showing a portion of the edge card connector.

FIG. 1A is a diagram showing a top metal layer of a universal test coupon 10 in accordance with the present invention. In accordance with the present invention, the test coupon 10 includes multiple test structures 12, an edge card connector 14 for providing external electrical connections, and metal traces 16 patterned on the test coupon 10 for connecting the test structures 12 with the edge card connector 14. In a preferred embodiment, the metal used to form the edge card connector 14 is copper.

The edge card connector 14 allows the incorporation of many different test structures 12 into one test coupon 10 because the edge card connector 14 makes it feasible to have multiple connections to the test structures 12 via the metal traces 16. In a preferred embodiment, the test coupon includes all known test structures vulnerable to failure with an equator greater number of possible failure sites as a production substrate. As an example, the test coupon 10 is shown with a top layer comb pattern, a via chain, and probe pads leading to the via chain and other test structures within the test coupon.

In a preferred embodiment, the test coupon also includes a palate position indicator 20 so that if a failure is detected in the test coupon, its location on the palate may be used to help determine the cause of the failure.

Figure 2:
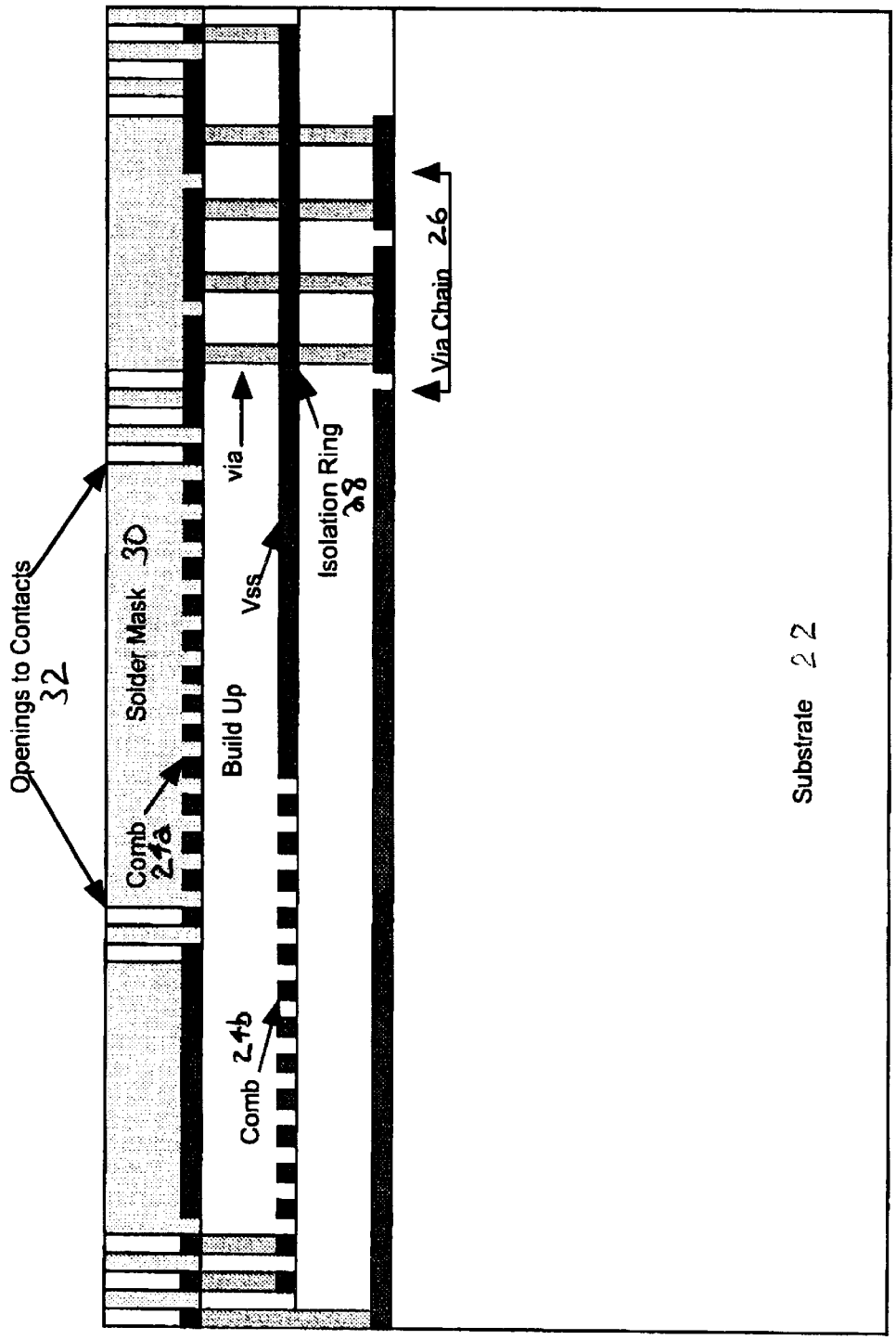
FIG. 2 is a cross-section of the test coupon further showing example test structures that may be incorporated into the test coupon.

FIG. 2 is a cross-section of the test coupon 10 further showing examples of test structures 12 that may be incorporated into the test coupon 10. A typical 4–8 layer substrate 22 has two ground planes and two power planes. One comb pattern 24A is shown on the top metal layer, and a second comb pattern 24B is shown on a second layer. The comb patterns 24 depict cross-sections of traces that typically connect to a ball grid array. During the Bias/Humidity/Temperature pre-qualification test; ion migration between the traces needs to be tested.

A via chain 26 test structure (referred to in FIG. 1A) is shown extending between the second and third layers in FIG. 2. Where the vias 26 pass through the power and ground planes, isolation rings 28 are used to isolate the vias 26. Isolation rings 28 represent another test structure 12 on the test coupon 10 because during prequalification testing, the isolation rings 28 need to be checked for ion migration or shorts across the ring 28. It will also be used to see if chain resistance is increased due to corrosion.

Although not shown in FIG. 1A, the top of the test coupon 10 is covered with a solder mask 30, as shown in FIG. 2. Openings referred to as probe pads 32 are made in a solder mask 30 to contacts below that can be used to probe for shorts within the various layers. As shown in FIG. 1A, metal traces 16 may then be deposited as desired between the edge card connector 14 and probe pads 32 to establish the desired connections. During the Bias/Humidity/Temperature prequalification test, the solder mask 30 needs to be checked to see if it is working properly, and also if there is leakage between the planes.

A test coupon 10 having multiple test structures 12 more accurately represents the distribution of quality of a production substrate made with the same geometric configurations and fabrication techniques as the test coupon. In addition, the edge card connector 14 eliminates the need to the manually solder wires between the test coupon 10 and sockets. In a preferred embodiment, connection is made with the external card connector 14 using a clamp-type mating female connector. This makes testing the test coupon 10 easier and saves time and money during a pre-qualification test. The present invention also makes it easier to analyze multiple coupons simultaneously, thereby providing good statistical quality and reliability data.

FIG. 1B is a cross-section view of the test coupon 10 showing a portion of the edge card connector 14. As shown, the substrate 22 comprising the test coupon 10 is covered with the solder mask 30 and a buildup layer 32, and the edge card connector 14 is formed in the top of the buildup layer 32. In accordance with the present invention, re-flowed paste solder 34 is deposited over the edge card connector 14 to prevent corrosion when contact is made with the clamp-type female connector.

Figure 3:
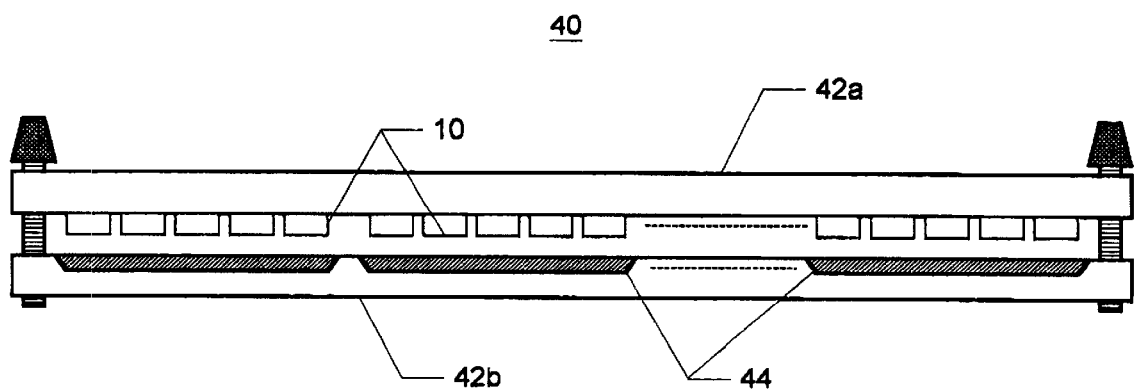
FIG. 3 is a diagram illustrating a test coupon female edge connector design in one preferred embodiment.

FIG. 3 is a diagram illustrating a test coupon female edge connector design in one preferred embodiment. The clamp 40 includes two sides, where one side 42A houses several groups of test coupons 10, and the other side 42B includes opposing female edge connectors 44. When the two sides 42 of the clamp 40 are screwed together, the edge connector 14 on each of the test coupons 10 is forced in contact with the female edge connector 44 located on the other side 42B of the clamp 40.

Figure 4:
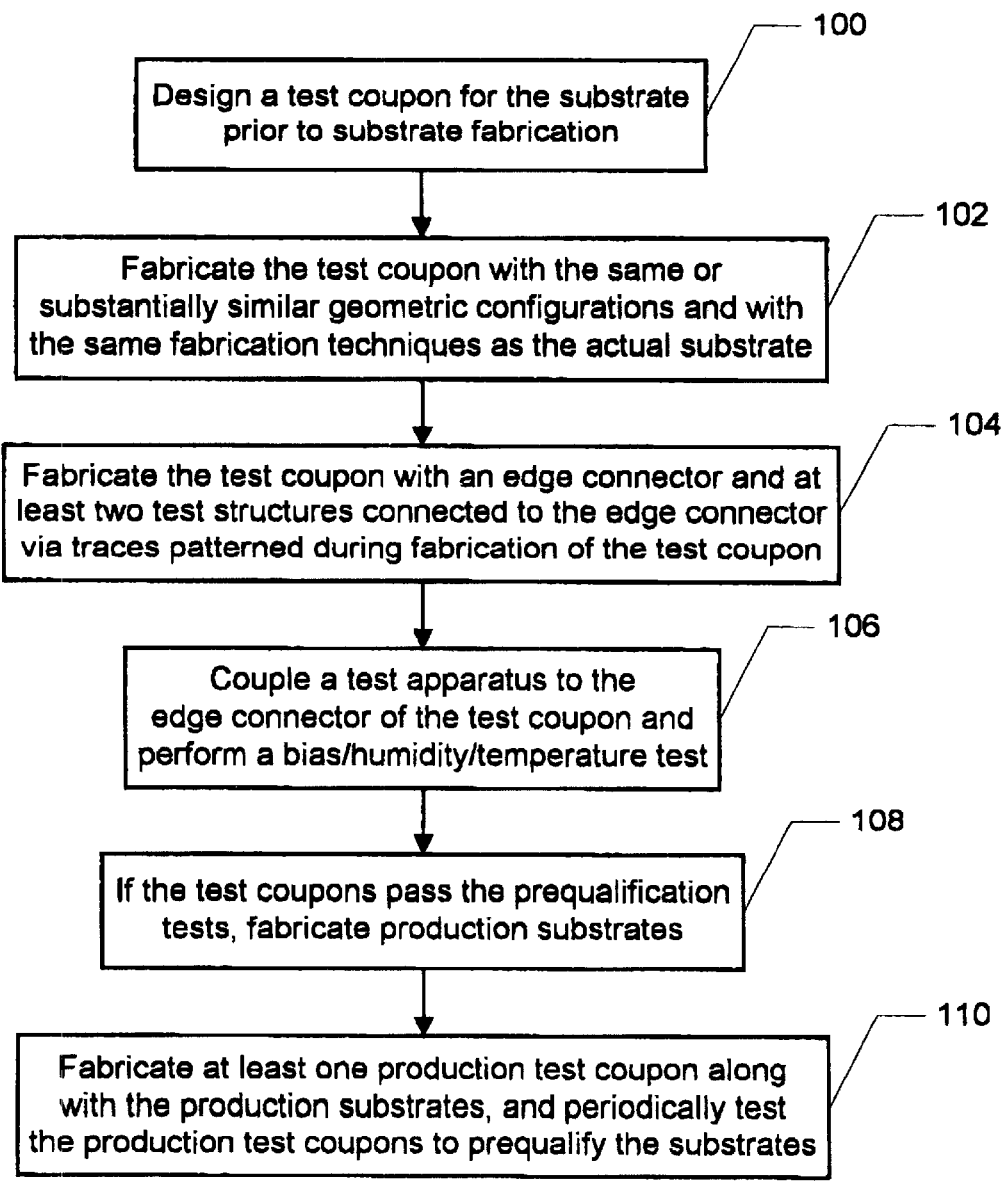
FIG. 4 is as a flow chart illustrating a process for performing pre-qualification test on a substrate in accordance with the present invention.

FIG. 4 is a flow chart illustrating a process for performing pre-qualification test on a substrate in accordance with the present invention. The process begins by designing universal a test coupon 10 for the substrate prior to substrate fabrication in step 100. Of course the substrate that is to be made is designed with a particular geometric configurations and will be manufactured with particular fabrication techniques.

The test coupon 10 is then fabricated with the same or substantially similar geometric configurations as the actual substrate and manufactured with the same or substantially similar fabrication techniques in step 102. The test coupon 10 is fabricated with an edge connector 14 and at least two test structures 12 connected to the edge connector via traces 16 patterned during fabrication of the test coupon 10 in step 104. In a preferred embodiment, the edge connector 14 and the metal traces 16 are formed during fabrication of the top layer of the test coupon 10.

After one or more test coupons 10 have been fabricated, a test apparatus is coupled to the edge connectors 14 of the test coupons 10 and a Bias/Humidity/Temperature test is performed on the test coupons 10 in step 106. As stated above, the test apparatus is connected to the test coupons 10 with a female clamp, eliminating the need to manually solder connections to the test coupon prior to testing.

If the test coupons 10 pass the pre-qualification tests, production substrates may then be fabricated in step 108. In addition, at least one production test coupon may be fabricated along with the production substrates, and the production test coupons may be periodically tested to pre-qualify the substrates in step 110.

A test coupon for performing pre-qualifiation tests on flip-chip organic substrates has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A test coupon for performing pre-qualification test on a substrate, comprising:

at least two substrate test structures including a combination of comb patterns and via chains;

an edge connector for providing external electrical connections; and traces patterned on the test coupon for connecting the test structures with the edge connector, wherein a test apparatus maybe coupled to the edge connector for testing the test coupon without the need to manually solder conections to the test coupon.

2. The test coupon of claim 1 wherein the substrate comprises a flip-chip organic substrate.

3. The test coupon of claim 1 wherein the test apparatus is coupled to the edge connector the connection using a clamp-type mating female connector.

4. The test coupon of claim 3 wherein a substrate comprising the test coupon is covered with a solder mask and a buildup layer, and the edge card connector is formed in the top of the buildup layer.

5. The test coupon of claim 4 wherein re-flowed paste solder is deposited over the edge card connector to prevent corrosion when contact is made with the clamp-type female connector.

6. The test coupon of claim 5 wherein the clamp-type female connector comprises a clamp that includes two sides, wherein one side houses several groups of test coupons, and the other side includes opposing female edge connectors, such that when the two sides of the clamps are screwed together, the edge connector on each of the test coupons is forced in contact with the female edge connector located on the other side of the clamp.

7. The test coupon of claim 5 wherein the test coupon includes probe pads leading to the test structures within the test coupon.

8. A test coupon for performing pre-qualification test on a substrate, comprising:

at least two substrate test structures;

a palate position indicator;

an edge connector for providing external electrical connections; and traces patterned on the test coupon for connecting the test structures with the edge connector, wherein a test apparatus maybe coupled to the edge connector for testing the test coupon without the need to manually solder connections to the test coupon.

9. A test coupon for performing pre-qualification test on a substrate, comprising:

at least two substrate test structures;

a copper edge connector for providing external electrical connections; and traces patterned on the test coupon for connecting the test structures with the edge connector, wherein a test apparatus maybe coupled to the edge connector for testing the test coupon without the need to manually solder connections to the test coupon.

* * * * *